United States Patent [19]
Tanno et al.

[11] Patent Number: 5,398,092
[45] Date of Patent: Mar. 14, 1995

[54] METHOD AND APPARATUS FOR DEVELOPING LITHOGRAPHIC OFFSET PRINTING PLATE

[75] Inventors: Yoshiyuki Tanno; Masakazu Ando; Hidemi Hanada; Masahiko Saikawa, all of Tokyo, Japan

[73] Assignee: Mitsubishi Paper Mills Limited, Tokyo, Japan

[21] Appl. No.: 86,848

[22] Filed: Jul. 7, 1993

[30] Foreign Application Priority Data

| Jul. 8, 1992 | [JP] | Japan | 4-047742 U |
| Jul. 8, 1992 | [JP] | Japan | 4-047743 U |
| Jul. 8, 1992 | [JP] | Japan | 4-047744 U |
| Jul. 8, 1992 | [JP] | Japan | 4-181214 |
| Jul. 8, 1992 | [JP] | Japan | 4-181216 |
| Jul. 28, 1992 | [JP] | Japan | 4-201347 |
| Jul. 28, 1992 | [JP] | Japan | 4-201348 |
| Feb. 23, 1993 | [JP] | Japan | 5-033015 |
| May 13, 1993 | [JP] | Japan | 5-111883 |

[51] Int. Cl.⁶ .................................... G03D 5/00
[52] U.S. Cl. .................................... 354/317
[58] Field of Search ............ 354/317, 318; 118/119, 118/126, 123, 212, 410, 414, 419

[56] References Cited

U.S. PATENT DOCUMENTS 5,153,033 10/1992 Shibata et al. .................. 118/410

FOREIGN PATENT DOCUMENTS 48-76603 10/1973 Japan .
57-115549 7/1982 Japan .
62-238564 10/1987 Japan .

*Primary Examiner*—D. Rutledge
*Attorney, Agent, or Firm*—Cushman, Darby & Cushman

[57] ABSTRACT

A developing apparatus for a lithographic offset printing plate, including: a developer applying device including a pair of rod-shape members which are not rotated; and a developer supply device disposed above said developer applying means and a method adapted to the apparatus and including a step of supplying a developer to either of said rod-shape members that face the surface of said lithographic offset printing plate on which a silver halide emulsion layer has been formed by application.

21 Claims, 5 Drawing Sheets

METHOD AND APPARATUS FOR DEVELOPING LITHOGRAPHIC OFFSET PRINTING PLATE

BACKGROUND OF THE INVENTION

Field of the Invention

The present invention relates to an apparatus for developing a photosensitive lithographic offset printing plate, and more particularly to an apparatus for developing a lithographic offset printing plate using a silver salt diffusion transfer method.

Related Background Art

A lithographic offset printing plate is composed of oleophilic image areas which receive ink and hydrophilic non-image areas which do not receive the ink. The non-image area is usually made of hydrophilic material which receives water. In an ordinary lithographic offset printing process, both water and ink are supplied to the surface of the printing plate. The image areas selectively receive ink, while the non-image areas selectively receive water. The ink on the image area is transferred to a member, such as paper, so that printing is performed.

Therefore, in order to obtain satisfactory printed products, the oleophilic properties of the image areas and the hydrophilic properties of the non-image areas must be sufficiently different from each other to cause the image areas receive ink by a sufficiently large quantity and the non-image areas do not receive the ink when water and the ink are supplied to the surface of the printing plate.

Lithographic offset printing plates adapted to a silver complex salt diffusion transfer method (a DTR method), in particular, lithographic offset printing plates each having a physical development nuclei layer formed on a silver halide emulsion layer have been disclosed in U.S. Pat. Nos. 3,728,114, 4,134,769, 4,160,670, 4,336,321, 4,501,811, 4,510,228 and 4,621,041 and so forth. According to the foregoing disclosures, exposed silver halide crystals so take place a chemical development due to the DTR development as to be black silver, causing hydrophilic non-image areas to be formed. On the other hand, the non-exposed silver halide crystals are converted to be silver salt complexes by silver salt complexing agents to diffuse to reach the surface physical development nuclei layer. As a result, the presence of the nuclei causes a physical development to take place so that image areas mainly composed of the ink receptive physical developed silver are formed.

In the method of processing the printing plate for the lithographic offset printing method, an automatic process camera including a developing vessel and a neutralizing vessel has been used. However, the plate processing method using the process camera has not been satisfactory to quickly complete the required process. Further, it involves a Coo complicated maintenance work to be performed. In a viewpoint of solving the environmental problem, there has been a desire for a plate processing system from which the quantity of waste liquid can be reduced or it can be eliminated, which enables the time taken to complete the process to be shortened and which is freed from the maintenance operation. Further, continuity of the development process performed by the method of a type, in which the lithographic offset printing plate is dipped in the developing vessel, encounters a multiplicity of problems of a fall of pH, reduction in the developing speed, generation of silver sludge, generation of a drug pattern due to the movement of the developer, and running of image due to the flow of the silver complex.

Japanese Patent Laid-Open Nos. 48-76603 and 57-115549 and so forth have disclosed a method of processing a printing plate of a type in which a developer is applied to the surface of the printing plate by a quantity required to develop the lithographic offset printing plate. However, the application methods disclosed in Japanese Patent Laid-Open No. 48-76603, such as a method using a roller above liquid, a drip method using a roller, and a drip method using a knife, must use a considerably large quantity of excess developer if uniform development is intended to be performed with a developer by a quantity substantially required to perform the development. What is worse, the spray-type application method and a brush application method cannot uniformly apply the developer.

SUMMARY OF THE INVENTION

An object of the present invention is to provide a developing apparatus capable of satisfactorily developing a lithographic offset printing plate adapted to a silver complex salt diffusion transfer method while overcoming problems taken place in processing a printing plate by a dipping development method, exhibiting capability of quickly performing the required process, easy maintenance, reducing the quantity of waste developer and forming a uniform printed images and to provide a development method using the developing apparatus.

The foregoing object of the present invention can be achieved by a developing apparatus for a lithographic offset printing plate, comprising: developer applying means including a pair of rod-shape members which are not rotated; and developer supply means disposed above the developer applying means.

Other and further objects, features and advantages of the invention will be appear more fully from the following description.

DESCRIPTION OF THE PREFERRED EMBODIMENTS

A developing apparatus and a developing method using the same according to the present invention will now be described in detail with reference to the drawings.

Figure 1:
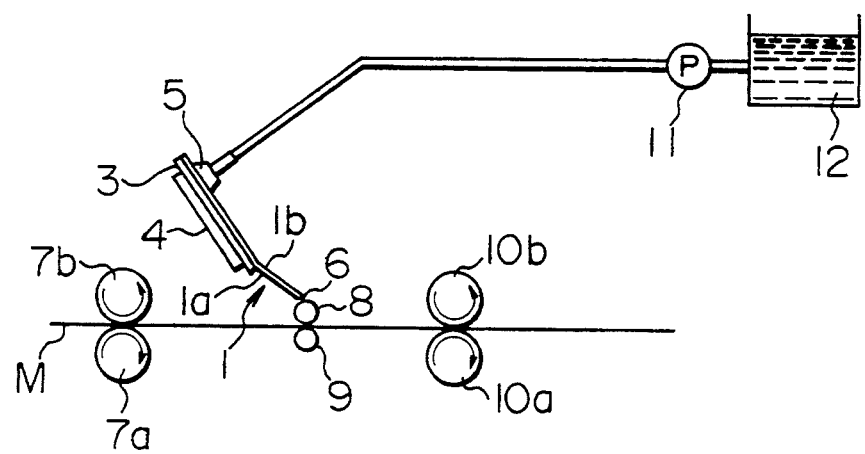
FIG. 1 is a schematic view which illustrates the overall structure of a developing apparatus according to a first embodiment of the present invention.
Figure 2:
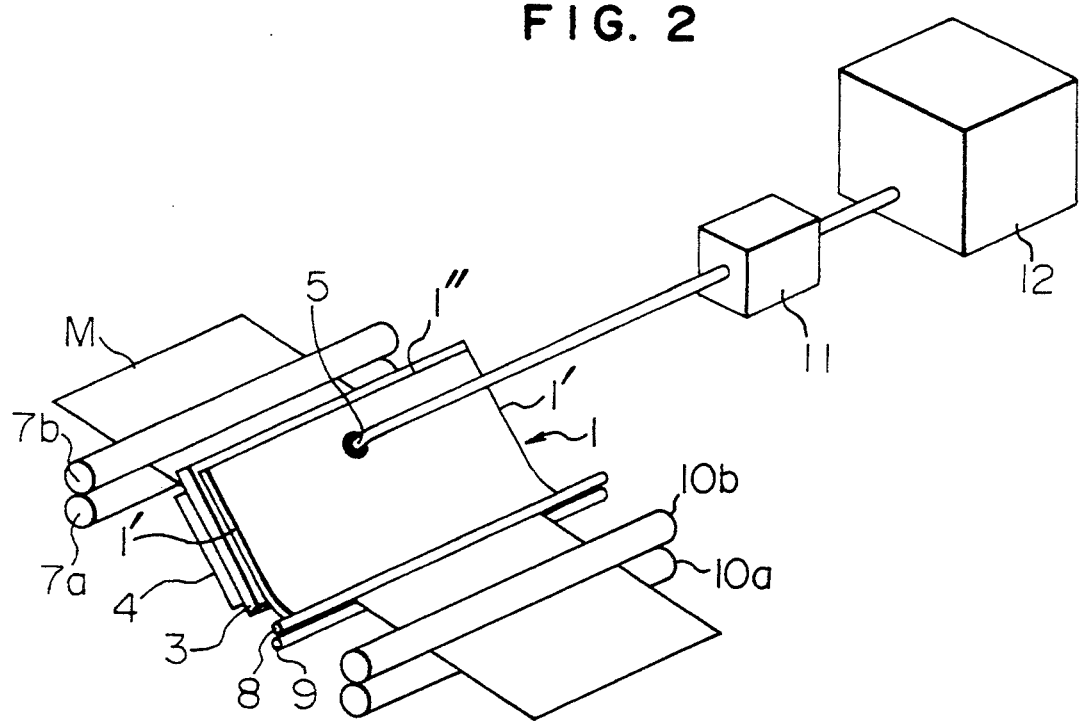
FIG. 2 is a perspective view which illustrates an essential portion of the developing apparatus shown in FIG. 1.
Figure 3:
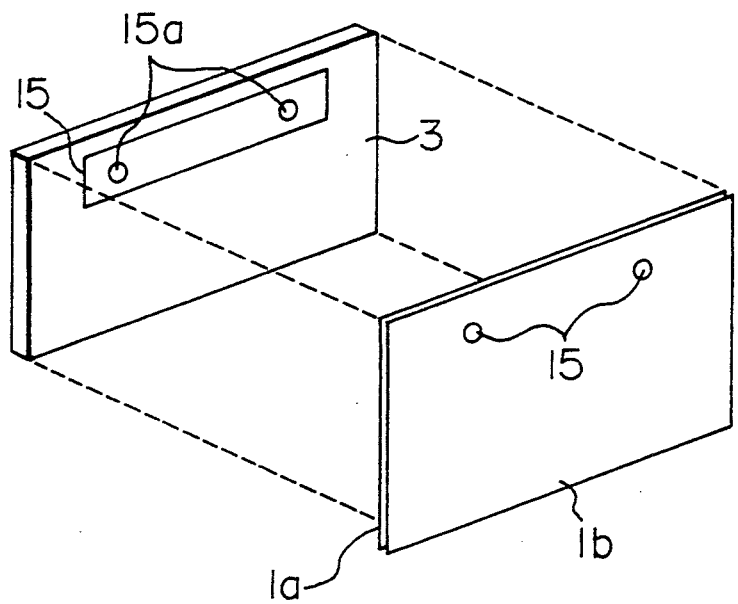
FIG. 3 is a perspective view which illustrates a support plate for use in the developing apparatus shown in FIG. 1.
Figure 4:
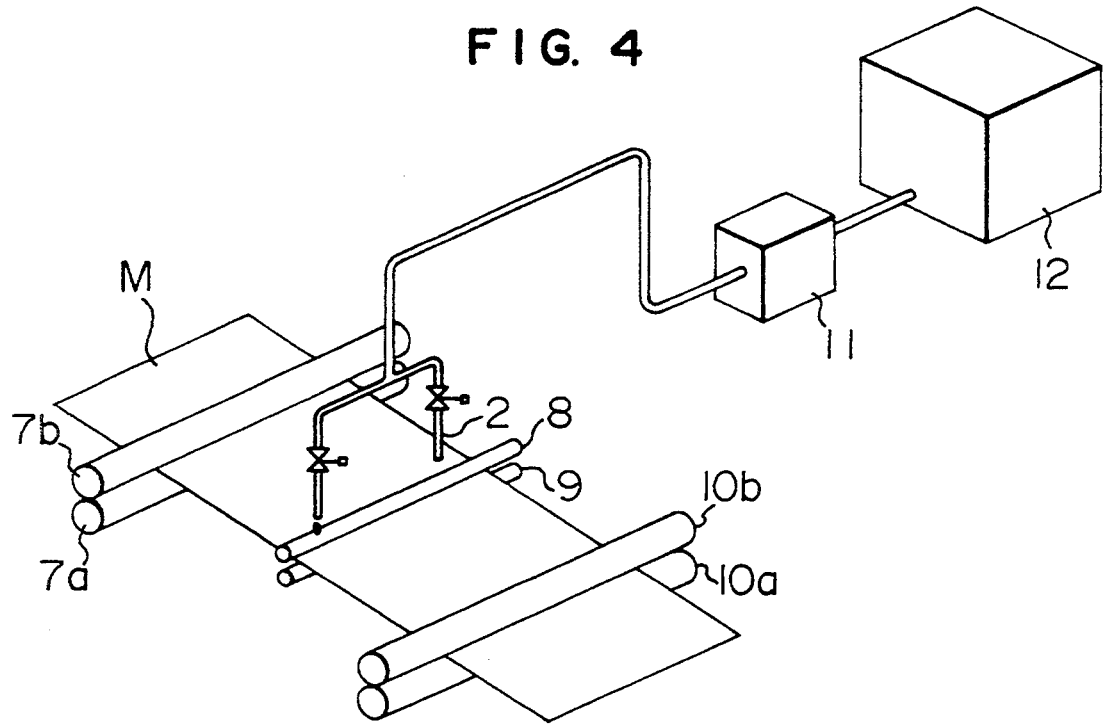
FIG. 4 ms a perspective view which illustrates a developing apparatus according to a second embodiment of the present invention.

FIG. 1 is a side elevational view which illustrates a first embodiment of a developing apparatus according to the present invention. FIG. 2 is a perspective view which illustrates the developing apparatus. FIG. 3 is a perspective view which illustrates a support plate of the apparatus shown in FIG. 2. FIG. 4 is a perspective view which illustrates a second embodiment of the developing apparatus according to the present invention. Referring to FIGS. 1 and 2, a slit-type developer supply unit 1 serving as a developer supply means is disposed above a developer application portion composed of a pair of rod-shape members 8 and 9 which cannot be rotated. Referring to FIG. 4, a developer dropping nozzle 2 serving as the developer supply means is disposed on the developer application portion.

Referring to FIGS. 1 and 2, the developer supply unit 1 is basically structured so that a slit-type opening portion 6 composed of sheets 1a and 1b (although the expression is made as "sheets" for convenience, it does not always mean the two sheets). Further, a developer supply portion 5 is disposed in an upper portion, the developer supply portion 5 being arranged to supply a developer to a position between the sheets 1a and 1b from a developer vessel 12 by a determined-quantity pump 11. The pair of the rod-shape members 8 and 9, which do not rotate, is disposed in the widthwise direction below the leading portion of the sheet 1b. The unit 1 is detachably fixed to a support plate 3.

In the preferred embodiment shown in FIGS. 1 and 2, the two sheets 1a and 1b are formed into the developer supply unit 1, the two side ends 1 and the top ends 1" of which are closed and the lower end 6 of which is opened. As a result, the developer is supplied by the determined-quantity pump 11 by only a quantity which is substantially required to develop a lithographic offset printing plate M. Therefore, the developer is able to substantially spread in the widthwise direction to be discharged through the slit-type opening portion 6. During the conveyance of the lithographic offset printing plate M, the developer supplied from the determined-quantity pump 11 is discharged through the slit-type opening portion 6. During the period in which the lithographic offset printing plate M is not conveyed, the determined-quantity pump 11 is not operated so that the developer is not discharged because it is confined in the developer supply unit 1. The shape, in which only the lower end 6 of the developer supply unit 1 is opened, may be formed by integral molding in place of using the two sheets. As an alternative to this, the sheet is bent, and the two sides ends are joined up with a tape or an adhesive agent or melting while placing the fold at the top end.

The sheet for constituting the developer supply unit 1 may be, for example, a plastic film made of polyester, polypropylene, polyvinyl chloride, polyethylene or polystyrene, or metal such as stainless steel or rubber. The material must be so selected as to prevent corrosion occurring due to the pH of the developer and various components. It is preferable that the thickness of the sheet is about 100 to 500 m. The lengths of the sheets 1a and 1b in the lower end opening portion 6 may be the same or different from each other.

The developer supply unit 1 has the developer supply portion 5 above a sheet 2a and/or a sheet 2b. As a result, the contact realized by the sheet 2a and 2b can substantially be maintained from the developer supply portion 5 to the slit-type opening portion 6 so that the undesirable reservation of the developer can substantially be prevented. The illustrated embodiment has an arrangement that the developer supply portion 5 includes a jig made of metal or plastic and serving as a developer supply port is fastened to the sheet 2b. Further, a tube extending from the determined-quantity pump is detachably fastened to the developer supply port. It is preferable that the length from the developer supply portion 5 to the slit-like opening portion 6 is minimized because the developer retains in the unit when the lithographic offset printing plate M is not conveyed. However, if it is shortened excessively, the developer cannot easily uniformly spread in the widthwise direction. Therefore, the optimum length must be determined depending upon the interval between the sheet 2a and the sheet 2b and upon the width of the lithographic offset printing plate M. It is preferable that the length is 30 mm to 300 mm. However, the length may be changed if necessary because it is also different depending upon the characteristics of the developer, such as the viscosity and the surface tension, and upon the speed at which the developer is supplied.

In the developing apparatus shown in FIGS. 1 and 2, it is preferable that the sheets 1a and 1b are in closely contact with each other from the developer supply portion 5 to the slit-type opening portion 6. The close contact between the sheets 1a and 1b causes the supplied developer to spread in the widthwise direction of the sheets 1 and 1b due to a capillary phenomenon. As a result, the quantity of the developer only required to develop the lithographic offset printing plate can further easily be controlled to be uniform in the widthwise direction. The interval between the sheet 1a and the sheet 1b must be determined to allow the supplied developer to spread in the widthwise direction although the optimum interval is different depending upon the characteristics of the developer, such as the viscosity and the surface tension, and upon the speed at which the developer is supplied. In general, it is preferable that the interval is 0.5 mm or less.

Because too little developer is usually discharged through the slit-like opening portion 6 of the developer supply unit 1, the developer cannot be spread in the widthwise direction. Therefore, there arises a problem in that the developer supplied to be applied to the surface of the lithographic offset printing plate M frequently encounters irregular development at the leading portion of the lithographic offset printing plate. Accordingly, the pair of the rod-shape members 8 and 9, which do not rotate, are disposed in the widthwise direction below the leading portion of the slit-type opening portion 6 so as to make the discharged developer come in contact with the rod-shape member 8. As a result, the developer can be spread between the nips of the rod-shape members 8 and 9 and a retainer is formed so that the developer can uniformly be applied and developed starting at the leading portion of the lithographic offset printing plate H.

If the pair of the rod-shape members 8 and 9, which do not rotate, have the foregoing function, the present invention is not limited to the circular or semicircular rod while having arbitrary shape and size. Further, the rod-shape member 8 does not need to be fastened and secured to the leading portion of the sheet a. Further, they may be positioned while having a slight gap which allows the developer to come in contact. The material of the rod-shape members 8 and 9 may be arbitrarily selected from a group consisting of metal, rubber, plastic and glass and so forth.

As described above, a little developer is discharged through the slit-type opening portion 6 of the developer supply unit 1. Therefore, even if the temperature of the developer in the developer vessel 12 is adjusted, there arises a problem that the temperature of the developer in the unit is considerably affected by the season or the change in the operational environment and, accordingly, the state of processing the lithographic offset printing plate M cannot be stabled. However, a heating means 4 provided for the sheet 1a and/or the sheet 1b is able to satisfactorily control the temperature of the developer even if the developer is flowing because a little developer is discharged. Therefore, a plate can be stably processed while exhibiting excellent reproducibility.

It is preferable that the support plate 3 shown in FIGS. 1, 2 and 3 is a metal plate made of stainless steel or the like. Further, a pin bar 15 having two or more pins 15a is disposed above the support plate 3. On the other hand, he sheet 1a and 1b of the developer supply unit 1 has pin holes 16 at positions corresponding to the pins 15a of the support plate 3. The pin holes 16 of the developer supply unit 1 are inserted by the pins 15a of the support plate 3 as to be secured by threads or the like. As a result, even if the developer supply unit 1 has been changed, the same positional accuracy with respect to the lithographic offset printing plate M can always be maintained.

The preferred embodiment shown in FIGS. 1 and 2 has an arrangement that the developer supply unit 1 is fastened to the support plate 3 made of the metal plate exhibiting excellent heat conductivity and a heater (the heating means) 4 is fastened to the support plate 3. The support plate 3 has a thermo-sensor (omitted from illustration).

Although the foregoing developing apparatus according to the present invention may be structured so that the two side ends of the sheets 1a and 1b are opened for example, it is preferable that only the lower end 6 of the developer supply unit 1 is opened in order to prevent leakage of the developer through the opening. Although the width of the developer supply unit 1 may be shorter than the width of the lithographic offset printing plate M to be processed by the apparatus according to the present invention, it is usually designed to be longer than the foregoing width (see FIG. 2). Also in this case, an advantage can be realized in that the developer does not substantially leak through the portion including the lower end opening portion 6 extending over the width of the lithographic offset printing plate M.

Although the developer supply unit 1 according to the present invention may have one developer supply portion 5, a plurality of the developer supply portions 5 may be used if necessary in a case where the lithographic offset printing plate M has a wide width for example. It is preferable that the developer supply unit 1 is formed into a curved shape having a moderate expanding portion in the lower portion thereof. It is preferable that the angle of inclination of the developer supply unit i is about 30° to 70° which is the angle of a straight line connecting the upper end portion and the lower end portion to each other.

Referring to FIG. 4, the developer dropping nozzle 2 is supplied with the developer from the developer vessel 12 by the determined-quantity pump 11. Referring to FIG. 4, two developer dropping nozzles 2 are used which may be arranged as to be alternately drop the developer by using an electromagnetic valve for example. The dropped developer spreads between the nips of the rod-shape members 8 and 9 in the widthwise direction, causing the developer to be reserved. As a result, uniform development starting from the lithographic offset printing plate H can be performed.

The developer supply means of the developing apparatus according to the present invention is not limited to the foregoing developer supply unit 1 or the developer dropping nozzle 2 if it is able to continuously supply a small quantity of the developer to the rod-shape members 8 and 9. For example, a shower-type means or a spray type means may be employed.

Then, the developing operation will now be described. Referring to FIGS. 1 to 4, when the developer in the developer vessel 2 is, by the determined-quantity pump 11, supplied to the developer supply unit 1 or the developer dropping nozzle 2, the developer is supplied on to the pair of the rod-shape members 8 and 9, which do not rotate. First, the developer supplied to the rod-shape members 8 and 9 is reserved between the nips of the two rod-shape members 8 and 9. The developer is reserved by a quantity which does not substantially drop downwards. Immediately after the foregoing state has been realized, the lithographic offset printing plate M is conveyed to reach the pair of the rod-shape members 8 and 9.

When the lithographic offset printing plate M has reached the rod-shape members 8 and 9, uniform development with the developer reserved in the nip is commenced starting from the leading portion of the lithographic offset printing plate M. Then the developer is reserved in a space between the rod-shape member 8 and the lithographic offset printing plate M, causing the developer to spread in the widthwise direction. Therefore, the continuation of the supply of the developer to the rod-shape members 8 and 9 enables the uniform development over the entire surface of the lithographic offset printing plate M to be performed. When the trailing end of the lithographic offset printing plate M approaches the pair of the rod-shape members 8 and 9, that is, when the rear end portion of the lithographic offset printing plate M can be developed with the developer which has been supplied, the stoppage of the determined-quantity pump 11 prevents the overflow of the developer from the nips of the pair of the rod-shape members 8 and 9 even after the lithographic offset printing plate H has been discharged from the pair of the rod-shape members 8 and 9 and the development has been completed.

The quantity of the supply of the developer to be applied to the lithographic offset printing plate H is usually 10 to 200 ml per $m^2$ although it varies depending upon the kind of the lithographic offset printing plate and upon the kind of the developer, preferably 20 to 100 ml. It is preferable that the viscosity of the developer is 0.5 to 100 cp. The speed at which the lithographic offset printing plate H is conveyed is 10 to 100 mm/sec, preferably 15 to 80 mm/sec. The time, in which the development is performed, is about 3 to 30 seconds although it varies depending upon the kind of the lithographic offset printing plate, the conveyance speed, the composition of the developer and the temperature at which the development is performed. It is preferable that the temperature, at which the development is performed, is 10 to 40° C. In this case, it is preferable that the sheet 1a is previously heated to a desired development temperature by the heating means 4.

In this embodiment, it is particularly preferable that the rod-shape member 8 is a roller-type rod-shape member having a groove such as a wire bar because the developer can be satisfactorily held, diffused and uniformly applied. In another embodiment of the present invention, it is preferable that the rod-shape member 9 is enabled to move away horizontally or downwards from the rod-shape member 8 in a period in which the development is not performed. As an alternative to this, it is preferable that the rod-shape member 9 is subjected to a water repellent process or a teflon treatment. As a result, the rod-shape member 9 is satisfactorily protected from contamination, resulting in an advantage to be obtained in that the reverse side of the lithographic offset printing plate M can be protected from contamination. The pair of the rod-shape members may be formed into arbitrarily shapes in place of the roller shape made of arbitrary material such as metal, for example, stainless steel, or rubber. It is preferable that the diameter of the rod-shape member is about 5 to 20 mm.

It is preferable that the developed lithographic offset printing plate M is subjected to a neutralization process. Although a conventional neutralization process may be employed in which the lithographic offset printing plate M is dipped in a neutralization vessel, it is preferable that a method similar to the development method according to the present is employed in which neutralizing solution is applied to the surface of the printing plate by a quantity required to neutralize the lithographic offset printing plate M in terms of reducing the quantity of the waste developer.

The lithographic offset printing plate to be processed by the developing apparatus according to the present invention and adapted to a silver complex salt diffusion transfer method has, on the support plate thereof, a base coating layer for preventing halation, a silver halide emulsion layer and a physical development nuclei layer. The silver halide emulsion layer is composed of, for example, silver chloride, silver bromide, silver bromine chloride and the foregoing material containing silver iodide. Silver halide crystal may contain heavy metal salts, such as rhodium salts, iridium salts, palladium sales, lutetium salts, nickel salts and platinum salts or the like. The form of the crystal of the silver halide is not limited particularly and it may be formed into a cubic shape, tetradecahedral shape, a core shell shape or tabular shape particles. The silver halide crystals may be monodispersed or polydispersed while having an average particle size of 0.2 to 0.8 mm.

The silver halide emulsion may be chemically sensitized with sodium thiosulfate or a gold compounds by a known method in the subject technical field. The silver halide can be positively or negatively sensitized by dyes such as cyanine or merocyanine. The spectral wavelength region is not limited particularly and, therefore, it may be orthochromatically sensitized, panchromatically sensitized, sensitized for helium-neon laser, sensitized for argon laser, sensitized for LED or sensitized for semiconductor laser.

The surface layer present on the emulsion layer contains the physical development nuclei. The physical development nuclei may be metal colloidal particles of silver, antimony, bismuth, cadmium, cobalt, lead, nickel, palladium, rhodium, gold or platinum, their sulfides, polysulfides or selenides or their mixtures or mixed crystals. The physical development nuclei may contain hydrophilic binder or does not need to contain the same. It may contain hydrophilic polymers or its oligomer of gelatin, starch, dialdehyde starch, carboxy methylcellulose, gum Arabic, sodium alginate, hydroxy ethylcellulose, polystyrene sulfonic acid, vinyl imidazole-acrylic amide copolymer or polyvinyl alcohol. It is preferable that the content is 0.5 g/m2 or less. The physical development nuclei layer may contain developing agents, such as hydroquinone or catechol, or a known hardener, such as formalin or dichloro-s-triazine.

The base coating layer, the silver halide emulsion layer and the physical development nuclei layer may contain some surfactants as application agents. Further, they may contain anti-fogging agents, matting agent, thickener and/or antistatic agent.

The substrate of the lithographic offset printing plate may be made of material, such as papers, synthetic or semi-synthetic polymer films or a metal plates made of aluminum or iron, which is able to tolerate the lithographic offset printing. Either or both of the surfaces of the substrate may be coated with one or more layers of polymer films or metal thin films. The surface of the substrate may be subjected to surface treatment in order to enhance adhesion with the coating layer. A substrate, which is used preferably, is paper having either or both sides coated with polyolefin polymer, a polyester film, polyester film having the surface which is subjected to hydrophilic treatment or an aluminum plate applied with surface treatment.

The developer for use in the present invention may contain an alkaline substance such as sodium hydroxide, potassium hydroxide, lithium hydroxide or sodium triphosphate, preservatives such as sulfite, silver halide solvent such as thiosulfate, thiocyanate, cyclic imide, 2-mercaptobebzonate, amine, anti-fogging agent such as potassium bromide, compounds disclosed in Japanese Patent Laid-Open No. 47-26201, developing agents such as hydroquenone, catechol, 1-phenyl-3-pyrazolidone, development denaturant such as polyoxyalkylene compound or onium compound. The developing solution may contain a compound which has been disclosed in, for example, U.S. Pat. No. 3,776,728 and with which the ink can be taken well on the surface silver layer.

The developer for use in the present invention may have a viscosity of 0.5 to 100 cp, preferably 1 to 20 cp by causing consistency enhancing agent such as carboxymethyl cellulose or hydroxyethyl cellulose as disclosed in Japanese Patent Laid-Open No. 48-76603.

The surface silver layer of the lithographic offset printing plane after the development has been performed can be converted into ink receivable characteristics or its receivable characteristics can be enhanced by an arbitrary one of known surface treatment agents. The chemicals of the foregoing type has been disclosed in, for example, Japanese Patent Publication No. 48-29723 or U.S. Pat. No. 3,721,559. The printing method, etching solution and a fountain solution may be a known method and materials.

The first embodiment of the present invention will now be described by explaining examples.

EXAMPLE 1

A developing apparatus shown in FIGS. 1 and 2 was manufactured. The manufactured apparatus did not comprise the support plate 3, the heating means 4, the pin bar 15 and the pin hole 16. The rod-shape member 8 was made of a wire bar having a diameter of 10 mm, while the rod-shape member 9 was made of a roller having a diameter of 10 mm and subjected to teflon treatment. The rod-shape members 8 and 9 were so arranged that they cannot be rotated. The lithographic offset printing plate M was conveyed at a speed of 30 m/sec. The developer was applied by a quantity of 40 ml per m² of the lithographic offset printing plate M.

The lithographic offset printing plate M was "Silver Master" (trade name) manufactured by Mitsubishi Paper Mills, Ltd. The developer and the neutralizer were composed as follows. The temperature was 23° C.

| <Transfer Developer> | |
|---|---|
| Water | 700 ml |
| Potassium hydroxide | 20 g |
| Sodium sulfite anhydride | 50 g |
| 2-mercaptobenzoic acid1 | 5 g |
| 2-methylaminoethanol | 15 g |

Water was added to make the quantity to be 1 litter.

| <Neutralizing Solution> | |
|---|---|
| Water | 600 ml |
| Citric acid | 10 g |
| Sodium Citrate | 35 g |
| Colloidal silica (20% solution) | 5 ml |
| Ethylene glycol | 5 ml |

Water was added to make the quantity to be litter.

When the developer was reserved in the nips of the rod-shape members 8 and 9, the leading portion of the lithographic offset printing plate M was conveyed to the rod-shape members 8 and 9 by the conveyance rollers 7a and 7b. When the trailing end of the lithographic offset printing plate M approached the rod-shape members 8 and 9, the determined-quantity pump 11 was stopped. After the development has been completed, the developer left by a slight quantity in the nips of the rod-shape members 8 and 9 did not overflow. Squeeze rollers 10a and 10b were used to squeeze the small quantity of the excess developer, followed by performing a process by using the following neutralizing apparatus. The neutralizing solution was controlled by the determined quantity pump 3 so that 35 ml of the neutralizing solution was supplied per 1 m² of the lithographic offset printing plate M.

The lithographic offset printing plate M manufactured as described above was loaded in a lithographic offset press, followed by equally supplying the following etching solution to the surface of the lithographic offset printing plate M. Then, the following fountain solution was used so that printing was performed.

| <Etching Solution> | |
|---|---|
| Water | 600 ml |
| Isopropyl alcohol | 400 ml |
| Ethylene glycol | 50 g |
| 3-mercapto-4-acetoamide-5-n-heptyl-1,2,4-triazole | 1 g |

| <Fountain Solution> | |
|---|---|
| o-phosphoric acid | 10 g |
| Nickel nitrate | 5 g |
| Sodium nitrite | 5 g |
| Ethylene glycol | 100 g |
| Colloidal silica (20% liquid) | 28 g |

Water was added to make the quantity to be 1 litter.

The printer was A. B. Dick 350 CD (trade mark of a lithographic offset press manufactured by A. B. Dick). The lithographic offset printing plate M enabled uniform development to be performed over the entire surface of the lithographic offset printing plate H while exhibiting satisfactory printing durability.

As can be seen from the above, the developing apparatus according to the present invention enabled the lithographic offset printing plate to be processed which enables the process to be completed quickly, the maintenance of which can easily be performed, with which the quantity of the waste developer can be reduced while using a little developer, with which image running and a drug pattern can be prevented and which exhibits satisfactory printing durability.

Another embodiment of the present invention will now be described.

Figure 5:
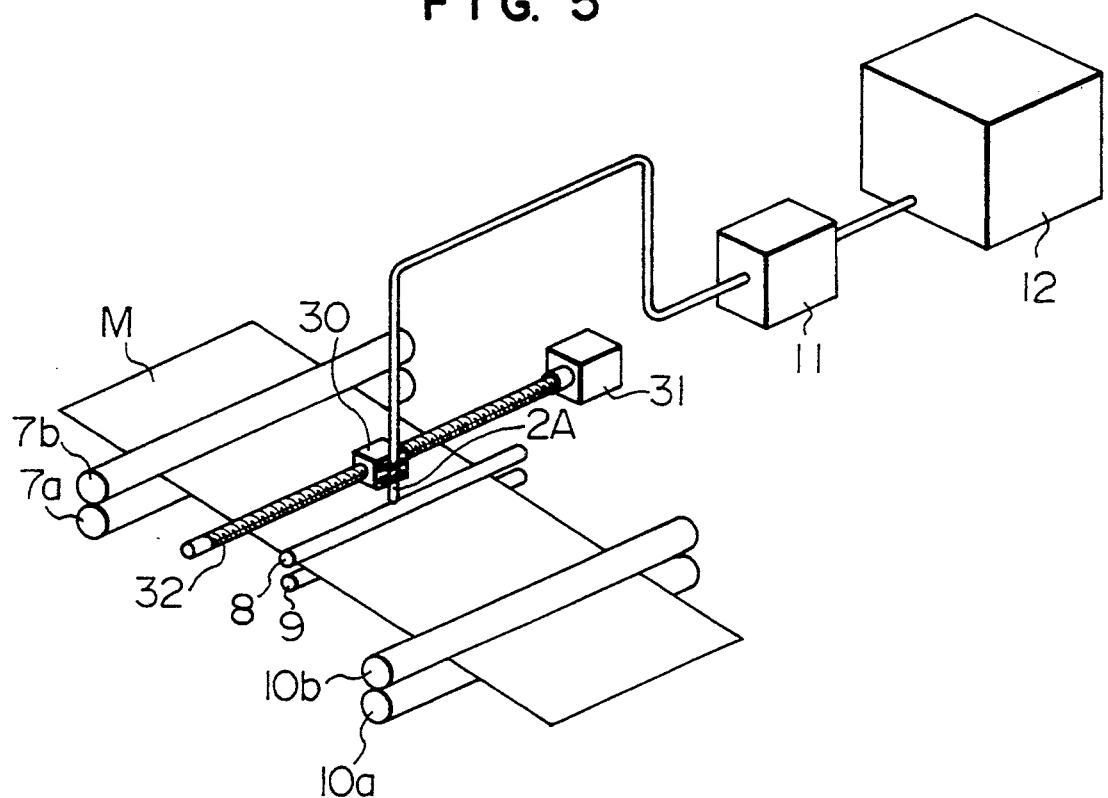
FIG. 5 is a perspective view which illustrates a developing apparatus according to a third embodiment of the present invention.
Figure 6:
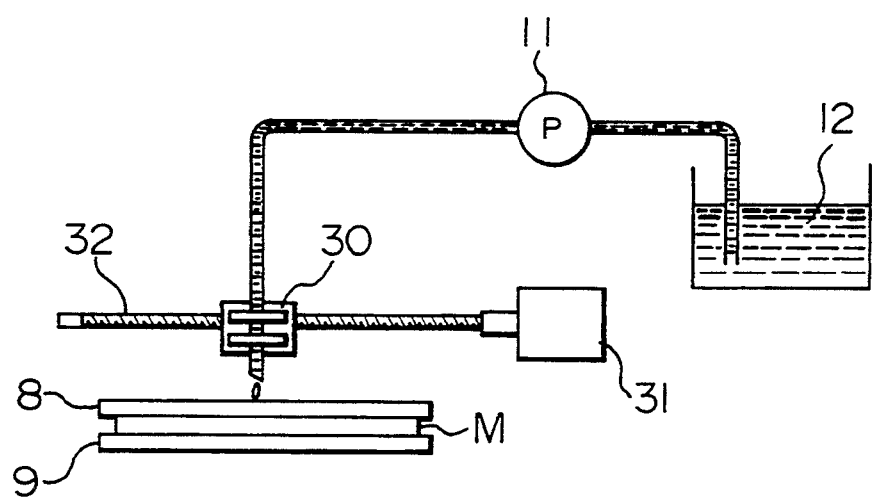
FIG. 6 is a side elevational explanatory view which illustrates the developing apparatus according to the third embodiment of the present invention.

FIG. 5 is a perspective view which illustrates an essential portion of a third embodiment of a developing apparatus according to the present invention. FIG. 6 is a front elevational view which illustrates a portion applied with the developer according to the third embodiment. A developer dropping nozzle 2A serving as the developer supply means is so disposed on a non-rotative rod-like developer application means, that is, the rod-shape member 8 that the developer dropping nozzle 2A is able to reciprocate (scanning).

Referring to FIG. 5, the developer dropping nozzle 2A is fixed to a nozzle fastening table 30. The nozzle fastening table 30 is able to reciprocate on a ball screw 32 by a table moving motor 31. A means for moving the developer dropping nozzle 2A may be a known means, such as a belt or a chain. The developer dropping nozzle 2A is supplied with the developer from the developer vessel 12 by the determined quantity pump 11. The developer dropping nozzle 2A may be disposed above the rod-type application means 8 or in front or in the rear of the rod application means 8 in the conveyance direction. The rod-type application means 8 forms a pair with the rod-type support means 9.

The development operation will now be described. When the developer in the developer vessel 12 is, by the determined quantity pump 11, supplied to the developer dropping nozzle 2A, the nozzle 2A is moved while dropping the developer on to the rod-type application means 8. The developer first dropped from the nozzle 2A which was being moved is reserved in the nips of the rod-type application means 8 and the rod-type support means 9 (the movement of the nozzle 2A may be performed by a plurality of times). The developer is reserved by a quantity which does not overflow. In this state, the lithographic offset printing plate M reaches the rod-type application means 8 simultaneously or somewhat delayed.

When the lithographic offset printing plate M has reached the rod-like application means 8 and rod-like support means 9, uniform development is, by the developer reserved in the nips, commenced starting at the leading portion of the lithographic offset printing plate M. Then, the developer is reserved between the rod-type application means 8 and the lithographic offset printing plate M. The tendency of the developer spreading in the widthwise direction enables uniform development to be performed on the entire surface of the lithographic offset printing plate M when the reciprocating movement of the nozzle 2A is continued. When the trailing end of the lithographic offset printing plate M has approached the rod-type application means 8, that is, when the trailing end portion of the lithographic offset printing plate M can be developed by the developer which has been already dropped, the stoppage of the determined quantity pump substantially prevents the overflow of the developer from the nips of the rod-type application means 8 and the rod-type support means 9 even after the lithographic offset printing plate H has been discharged from the rod-type application means and, accordingly, the development has been completed.

The quantity of the developer applied to the lithographic offset printing plate H, the viscosity of the developer and the conveyance speed of the lithographic offset printing plate H are the same as those according to the first and the second embodiments. The moving speed of the developer dropping nozzle 2 is 10 to 100 mm/sec, preferably 15 to 80 mm/sec. The time in which the development is performed is usually about 3 to 20 seconds although it varies depending upon the kind of the lithographic offset printing plate, the conveyance speed, the composition of the developer and the developing temperature.

The rod-type application means 8 and the rod-type support means 9 have similar arrangements as those of the rod-shape members 8 and 9 according to the first and second embodiments.

EXAMPLE 2

A developing apparatus shown in FIGS. 5 and 6 was manufactured. The rod-type application means 8 was made of a wire bar having a diameter of 10 mm, while the rod-type support means 9 was made of a roller having a diameter of 10 mm and subjected to teflon treatment. The rod-type application means 8 and the rod-type supporting means 9 were so arranged that they cannot be rotated. The scanning speed performed by the developer dropping nozzle 2A was made to be 50 mm/sec. The lithographic offset printing plate M was conveyed at a speed of 30 mm/sec. The developer was applied by a quantity of 30 ml per m² of the lithographic offset printing plate M.

The lithographic offset printing plate M was "Silver Master" (trade name) manufactured by Mitsubishi Paper Mills, Ltd. The developer and the neutralizer were the same as those according to Example 1. The temperature was 23° C.

When the nozzle 2A was moved from either end of the rod-type application means 8 until it reaches another end, the conveyance rollers 7a and 7b were used to convey the leading portion of the lithographic offset printing plate M to the rod-type application means 8. When the trailing end of the lithographic offset printing plate had approached the rod-type application means 8, the determined quantity pump 11 was stopped. After the development has been completed, the developer left by a slight quantity in the nips of the rod-type application means 8 and the rod-type support means 9 did not overflow. Squeeze rollers 10a and 10b were used to squeeze the small quantity of the excess developer, followed by performing a process by using the following neutralizing apparatus. The neutralizing solution was controlled by the determined quantity pump 11 so that 30 ml of the neutralizing solution was supplied per 1 m² of the lithographic offset printing plate M.

The lithographic offset printing plate M manufactured as described above was loaded in a lithographic offset press, followed by equally supplying the etching solution similar to that according to Example 1 to the surface of the lithographic offset printing plate M. Then, the following fountain solution was used so that printing was performed.

The printer was A. B. Dick 350 CD (trade mark of an offset printer manufactured by A. B. Dick). The lithographic offset printing plate M enabled uniform development to be performed over the entire surface of the lithographic offset printing plate M while exhibiting satisfactory printing durability.

Figure 7:
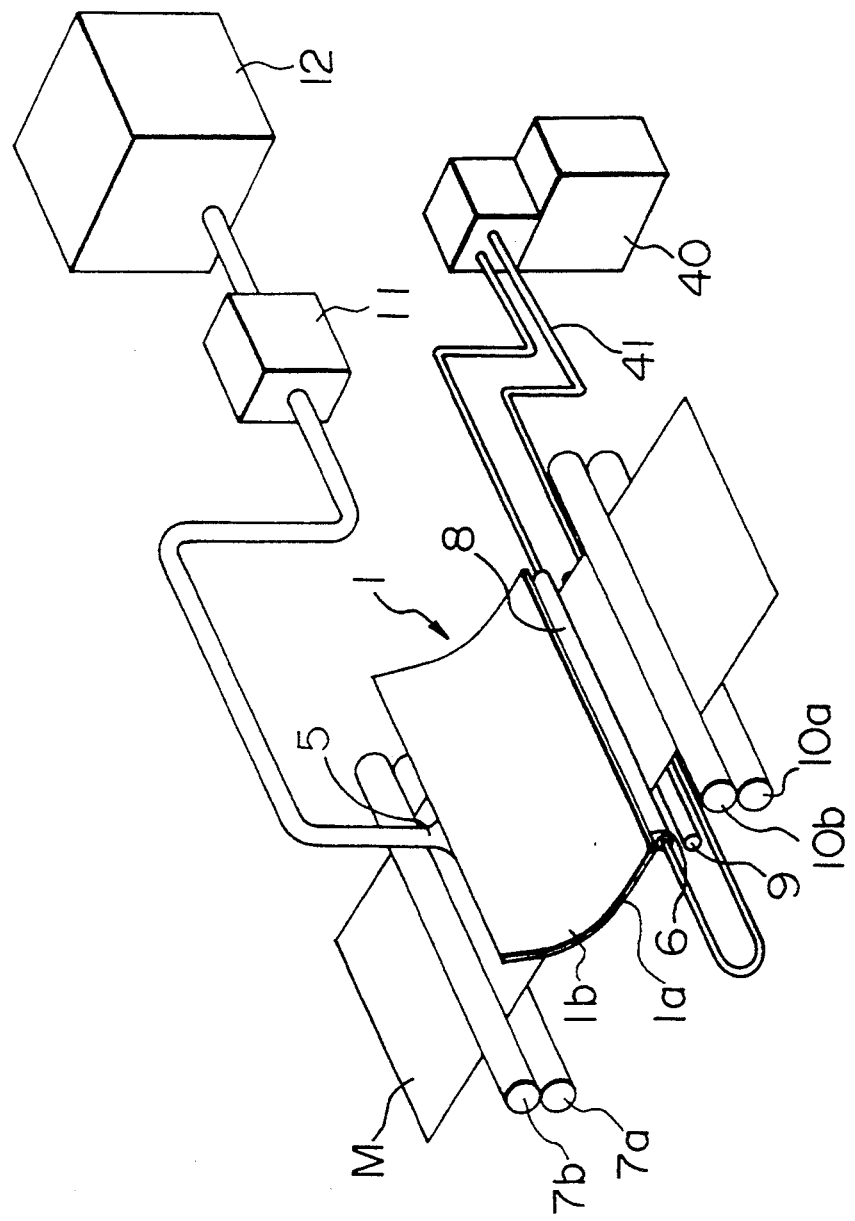
FIG. 7 is a perspective view which illustrates a developing apparatus according to a fourth embodiment of the present invention.

FIG. 7 illustrates a fourth embodiment of the present invention. The fourth embodiment has an arrangement that the support plate 3 and the heating means 4 according to the first embodiment shown in FIGS. 1 and 2 are omitted, but a heating means for heating the rod-shape member 8 of the pair of the rod-shape members 8 and 9 is provided, the rod-shape member 8 being supplied with the developer. The residual structures are similar to those according to the first embodiment.

The heating means according to the fourth embodiment comprises a circulation constant-temperature vessel 40 and a hose 41 having two ends connected to the circulation constant-temperature vessel 40. The heating means circulates hot water serving as a heating medium through the hose 41 to heat the rod member 8 to which the developer is supplied. It is preferable that the hose 41 penetrates the rod-shape member 8 in the longitudinal direction to extend continuously. Another structure may be employed in which the rod-shape member 8 is formed into a sleeve-like hollow shape, the hose 41 is fastened to the two ends of the rod-shape member 8 and the heating medium is circulated while passing through the inside portion of the rod-shape member 8 from the hose 41.

Figure 8:
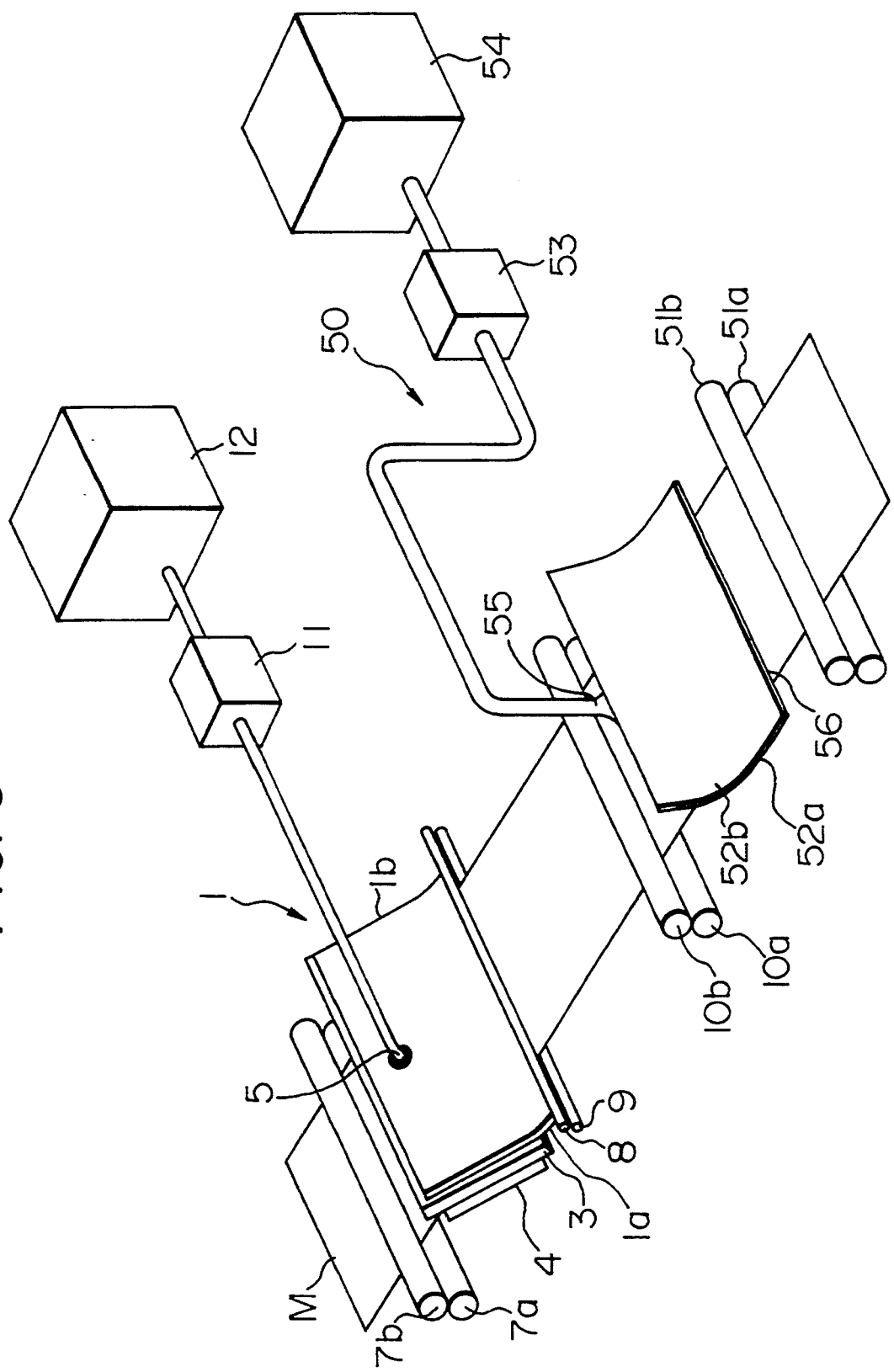
FIG. 8 is a perspective view which illustrates a developing apparatus according to a fifth embodiment of the present invention.

FIG. 8 illustrates a fifth embodiment of the present invention. The fifth embodiment is arranged so that a neutralizing solution supply apparatus 50 and means for removing the neutralizing solution, that is neutralizing solution squeezing rollers 51a and 51b are added to the apparatus according to the first embodiment shown in FIGS. 1 and 2. The residual structures are similar to those according to the first embodiment.

The apparatus according to the fifth embodiment is capable of performing a method of processing a lithographic offset printing plate by utilizing a silver salt complex diffusion transfer method including the steps of supplying (that is, applying) a developer to only a surface applied with a silver halide emulsion, removing the developer from the surface of the printing plate, supplying neutralizing solution (applying neutralizing solution) to only a surface on which the developer has acted, and removing neutralizing solution from the surface of the printing plate.

That is, according to the fifth embodiment, the developer is applied to the lithographic offset printing plate H adapted to the silver salt complex diffusion transfer method. Then, the developer on the surface of the printing plate is removed by squeezing rollers 10a and 10b. The foregoing process for removing the developer on the surface of the printing plate is able to reduce the quantity of neutralizing solution to be applied in the ensuing process and as well as to quickly and uniformly neutralize the structural layer of the lithographic offset printing plate. Therefore, a small quantity of neutralizing liquid is able to adjust the surface of the printing plate to be neutral or weak acid and also reduce the total waste of processing liquid.

After the process for removing the developer from the surface of the printing surface has been completed, neutralizing solution is applied by the neutralizing solution supply apparatus 50. Then, neutralizing solution on the surface of the printing surface is removed by squeezing the rollers 51a and 51b. In a case of an automatic process camera, a dry process is performed. Thus, the printing plate process is completed.

The quantity of the developer to be applied to the lithographic offset printing plate M is the same as that applied according to the first and the second embodiments. The quantity of neutralizing solution to be applied to the lithographic offset printing plate M varies depending upon the basicity of the developer and the acidity of neutralizing solution. The quantity is determined to make the pH of the lithographic offset printing plate M to be about 8 or lower, preferably about 3 to about 7.5. If the pH of the surface of the printing plate is higher than 8, the printing properties, such as the ink receptivity, deteriorate. The quantity is usually 10 to 200 ml per 1 $m^2$ of the lithographic offset printing plate M, preferably 20 to 150 ml. It is of course preferable that the quantity of the developer and neutralizing solution is minimized. It is preferable that the pH of neutralizing solution is about 3 to about 7.5. Although the time taken from the neutralizing process to squeezing performed with the squeezing rollers is not particularly limited because the neutralization can be achieved in several seconds, it is preferable that the time is about 3 to about 6 seconds.

The developer and neutralizing solution removed by the squeezing rollers or the like may be restored individually, followed by mixing them in the development processing apparatus or outside the same, and neutralizing and disposing them.

Adaptable neutralizing solution may use, as a pH adjuster and a cushioning material, citric acid, acetic acid, boric acid, phosphoric acid, sulfurous acid and their alkali metal salt. As a water softener, hexasodium metaphosphate may be used. As a hardener for the binder for preventing abrasion of the surface of the printing plate during the printing operation, the following materials may be used if necessary: organic compounds such as formalin, glyoxal, glutaric aldehyde, dimethylolurea or dimethylene urea resin or inorganic compound such as chrome alum or potassium alum. Further, printing-properties improving agent such as a hydrophilyzing agent, an antiseptic and mildew-proofing agent, humidifying agent, a thickener and/or a surfactant may be used. For example, gum Arabic, carboxymethy cellulose, sodium alginate, vinyl pyrolidone, vinyl imidazole, a copolymer of methylvinyl ether and maleic acid anhydride, alginic oxide cellulose, methylcellulose, sulfate (such as sodium sulfate or ammonium sulfate), polyol compounds having two or more hydroxy group (such as polyethylene glycol, pentaerythritol, diethylene glycol, glyceline or hexyleneglycol), inorganic particles (colloidal silica or alumina), polyacrylic acid or ethylenediaminetetraacetic acid, or their mixture may be used. In order to improve the identifying characteristics of the liquid, a coloring agent such as phthalocyanine type dye, malachite green or ultramarine, or a hydrate organic solvent (methanol, ethanol, propanol, isopropyl alcohol, n-butyl alcohol, dimethyl formaldehyde or dioxyane) may be contained.

The developer supply unit 1 has a basic structure that the sheets 1a and 1b are brought into closely contact with each other substantially over their entire surfaces. Further, the developer supply portion 5 for supplying the developer to a position between the two sheets 1a and 1b from the developer vessel 12 by the determined quantity pump 11 is disposed above the two sheets 1a and 1b. The apparatus for supplying the developer shown in FIG. 8 is the same as that shown in FIGS. 1 and 2.

The neutralizing solution supply unit 50 is structured as to have sheets 52a and 52b, a determine quantity pump 53, a neutralizing solution vessel 54 and a neutralizing solution supply portion 55 to correspond to the foregoing developer supply unit.

The sheets 52a and 52b are closely sealed up at their two side ends and the top ends, but their lower ends 56 are opened. As a result, neutralizing liquid can be supplied by the determined quantity pump 53 by only a quantity required to substantially neutralize the lithographic offset printing plate M. Therefore, neutralizing liquid is stably and uniformly discharged through a slit-like opening portion 56 in the widthwise direction. During the conveyance of the lithographic offset printing plate M, neutralizing liquid supplied by the determined quantity pump 53 is discharged through the slit-like opening portion. However, in a period in which the lithographic offset printing plate M is not conveyed, the determined quantity pump 53 is not operated so that neutralizing solution is confined in the neutralizing solution supply unit and, accordingly, it is not discharged.

The fourth embodiment shown in FIG. 8 may be modified so that the squeezing roller 10b of the two rollers 10a and 10b is omitted and the residual roller 10a is made to serve as a conveyance roller.

The apparatus modified as described above is structured so that the developer is supplied (that is, the developer is applied) to only a surface to which the silver halide emulsion is applied, neutralizing solution is supplied (that is, neutralizing solution is applied) to only a surface on which the developer acts in such a manner that the developer is not squeezed, and then the developer is squeezed.

The apparatus modified as described above is able to minimize the total quantity of waste processing liquid by processing the lithographic offset printing plate with the developer and neutralizing solution applied to the lithographic offset printing plate adapted to the silver salt complex diffusion transfer method. Further, the surface of the printing plate is adjusted to neutral or weak acidic. The developer left on the surface of the printing plate after the development has been completed is not squeezed so that the strong basic developer is not disposed. As an alternative to this, the developer left on the surface of the printing plate is mixed with neutralizing solution, and the neutralized mixture solution is squeezed by the squeezing rollers 51a and 51b to restore the solution as waste fluid to be discharged outside the development processing apparatus. Therefore, the strong basic solution can be substantially eliminated as the waste. As a result, neutral or weak acidic processed waste fluid is discharged by a small quantity from the development processing apparatus. Therefore, storage, transfer and process can easily be performed.

With the apparatus modified as described above, neutralizing solution is not specially used in the conventional dipping development method in which the development processing solution, the development processing performance has deteriorated, is restored as it is to be neutralized by using the neutralizing solution. Therefore, the quantity of the discharged liquid can further be reduced. Further, a risk that the developer flies at the time of mixing the neutralizing solution can be eliminated.

In the case where the developer and the neutralizing solution are individually restored, they are mixed in the development processing apparatus or outside the apparatus to be neutralized, a mixing apparatus must be used. However, the apparatus modified as described above realizes an advantage that the necessity of using the mixing apparatus can be eliminated because the neutralization of the developer is performed on the surface of the lithographic offset printing plate with neutralizing solution.

As a result of various examinations made by the inventors of the present invention, a fact was found that the method arranged so that the developer is supplied and applied to the surface of the printing plate by a quantity required to develop the lithographic offset printing plate results that the temperature of the surface of the lithographic offset printing plate is substantially the same as the temperature at which the development is performed. That is, the quantity of the waste developer can be minimized by supplying the developer by the minimum quantity. While subjecting the thermal capacity of the lithographic offset printing plate and that of the supplied developer to a comparison, the thermal capacity of the lithographic offset printing plate is larger than that of the developer. Therefore, even if the temperature of the developer is raised, the temperature at which the development is performed is undesirably made to be the same as the temperature of the surface of the lithographic offset printing plate. Hence, it is difficult to raise the temperature at which the development is performed by heating only the developer.

It might be considered feasible to employ a method in which the lithographic offset printing plate is heated in order to raise the temperature at which the development is performed to a desired level. The foregoing object can be realized by a known method. However, adaptation of the foregoing method to the developing apparatus raises problems in that the size of the apparatus cannot be reduced because the apparatus must be insulated from heat, a danger of fire arises due to the necessity of heating the lithographic offset printing plate, and electric power is consumed excessively.

The inventor of the present invention has examined to improve the development characteristics of the developer realized at low temperature in order to eliminate the necessity of maintaining the temperature at which the development is performed at a high level when the lithographic offset printing plate is processed by supplying and applying the developer to the surface of the printing plate by a quantity required to develop the lithographic offset printing plate by using the foregoing apparatus according to the embodiment of the present invention. As a result, a fact was found that addition of alkanol amine containing one or a plurality of primary amine groups to the developer by a predetermined quantity enabled an excellent lithographic offset printing plate to be obtained even at a low temperature of about 20° C. or lower. Another fact was found that addition of ions of thiocyanic acid enabled an excellent lithographic offset printing plate to be obtained even if the temperature is about 10° C.

The method of processing the lithographic offset printing plate by using the foregoing developer comprises the steps of first applying the developer to the lithographic offset printing plate adapted to the silver halide complex diffusion transfer method, and removing the developer on the surface of the lithographic offset printing plate by using the squeezing rollers or the like. In order to lower the pH of the surface of the printing plate, neutralizing solution or water cleaning is employed. Further, a drying process is performed in the case of the automatic process camera, so that the processing of the printing place is completed. If necessary, a process for heating the lithographic of set printing plate or the developer may, of course, be performed. It is preferable that the pH of the developer is about 11 or more and the temperature, at which the development is performed is about 10 to about 35° C.

The adaptable alkanol amine containing primary amine is exemplified by 2-amino ethanol, 2-amino propanol, 3-amino propanol, 2-amino-2-hydroxymethyl-propane-1,3-diol, 2-amino-2-methyl-propane-1,3-diol, 1-amino-propane-2-ol, 4-amino butanol, 5-amino pentane-1-ol and N-(-amino ethyl) ethanol amine, or their mixture. The foregoing material is added by 0.15 mol to 1.2 mol with respect to 1 litter of the developer, preferably 0.15 mol to 0.75 mol.

As the adaptable source for ions of thiocyanic acid, potassium thiocyanate, sodium thiocyanate or ammonium thiocyanate may be used. One or more material selected from the foregoing materials are used to be added as ions of thiocyanic acid by a quantity of 0.03 mol or more and 0.3 mol or less with respect to 1 litter of the developer.

The developer must contain an alkaline substance, such as sodium hydroxide, potassium hydroxide, lithium hydroxide or tribasic sodium phosphate, and sulfite (potassium sulfide or sodium sulfite) serving as a preservative. Further, the following compounds may be contained: sulfate (sodium sulfate or ammonium sulfate or the like), silver halide solvent (thiosulfate, cyclic imide, thiosalicylic acid or amine or the like), a consistency agent (gum Arabic, hydroxyethyl cellulose (HEC), carboxymethyl cellulose (CHC), sodium alginate, carboxymethyl starch or methyl cellulose or the like), antifogging agent (potassium bromide, 1-phenyl-5-mercaptotetrazole or compounds disclosed in Japanese Patent Laid-Open No. 47-26201 or the like), a developing agent (hydroquenone, 1-phenyl-3-pyrazolidone, methol, catechol, pyrogallol or glycine or the like), and development denatured agent (polyoxyalkytene compound or onium compound). Further, one or more kinds of surfactants may be contained. In addition, a hydrate organic solvent (methanol, ethanol, propanol, isopropyl alcohol, n-butyl alcohol, dimethyl formaldehyde or dioxyane or the like) may be contained.

EXAMPLE 3

The lithographic offset printing plate adapted to the silver salt complex diffusion transfer method was "Silver Master" (trade name) manufactured by Mitsubishi Paper Mills, Ltd. An image was exposed to the original of the lithographic offset printing plate by a process camera having an image reversal mechanism.

The developing apparatus, the printing plate conveying speed and the quantity of the developer applied to the printing plate were same as in the case of the previously described Example 1.

The samples were allowed to stand for about 5 seconds after the developer was applied and spread, followed by immediately and sufficiently cleaning the sample with water.

TABLE 1

| No. | <Developers-1> | | | | |
|---|---|---|---|---|---|
| | 1 | 2 | 3 | 4 | 5 |
| Water | 700 | 700 | 700 | 700 | 700 |
| Sodium Hydroxide/g | 5 | 5 | 5 | 5 | 5 |
| Potassium Hydroxide/g | 14 | 14 | 14 | 14 | 14 |
| Sulfurous sodium anhydride/g | 50 | 50 | 50 | 50 | 50 |
| Alkanol amine containing primary amino group/mol | 0.05 | 0.1 | 0.15 | 0.75 | 1.3 |
| Water is added to make the quantity to be 1 litter. | | | | | |

*As the alkanol amine containing primary amino group, 2-amino ethanol, 2-amino propanol and N-(β-aminoethyl) ethanol amine respectively were used solely.

As comparative samples, developers were prepared, to each of which alkanol amine was added, the structure of which was similar to the alkanol amine containing primary amino group and which did not contain primary amino group. The comparative samples were processed similarly to the foregoing samples.

TABLE 2

| No. | <Developers-2> | | | | |
|---|---|---|---|---|---|
| | 6 | 7 | 8 | 9 | 10 |
| Water | 700 | 700 | 700 | 700 | 700 |
| Sodium Hydroxide/g | 5 | 5 | 5 | 5 | 5 |
| Potassium Hydroxide/g | 14 | 14 | 14 | 14 | 14 |
| Sulfurous sodium anhydride/g | 50 | 50 | 50 | 50 | 50 |
| Alkanol amine which did not containing primary amino group/mol | 0.05 | 0.1 | 0.15 | 0.75 | 1.3 |
| Water is added to make the quantity to be 1 litter. | | | | | |

*As the alkanol amine which did not contain primary amino group, N,N'-dimethylethanol amine, N-methylethanol amine and N-methyldiethanol amine were used solely.

The foregoing lithographic offset printing plates were dried, and then they were set to a Heidelberg TOK lithographic offset press. Then, the following etching solution was applied uniformly to the surface of the printing plate. Then, the following fountain solution was used so that printing was performed.

TABLE 3

| <Etching Solution> | |
|---|---|
| Water | 600 ml |
| Isopropyl alcohol | 400 ml |
| Ethylene glycol | 50 g |
| 3-mercapto-4-acetoamide-5-n-heptyl-1,2,4-triazole | 1 g |

| <Fountain Solution> | |
|---|---|
| Water | 8 l |
| Citric acid | 6 g |
| Sodium sulfate | 25 g |

TABLE 3-continued

| Ethylene glycol | 100 g |
|---|---|
| Colloidal silica (20% solution) | 28 g |

The results of printing performed according to this embodiment and evaluated in accordance with the following criteria are shown in Table 5. The printing durability was judged by the following method.

Printing was performed to make 1,000 to 50,000 sheets and the printing durability was evaluated in accordance with the number of sheet at which lacking for ink took place by employing the following four classes.

TABLE 4

| A | 50,000 sheets or more |
|---|---|
| B | 25,000 sheets or more |
| C | 10,000 sheets or more |
| D | 5,000 sheets or more |

TABLE 5

| No. | Results of Printing Durability | Remarks |
|---|---|---|
| 1 | D | Comparative Sample |
| 2 | D | Comparative Sample |
| 3 | B | Present invention |
| 4 | B | Present invention |
| 5 | C | Comparative Sample |
| 6 | D | Comparative Sample |
| 7 | D | Comparative Sample |
| 8 | D | Comparative Sample |
| 9 | D | Comparative Sample |
| 10 | D | Comparative Sample |

As can be seen from Table 5, the lithographic offset printing plates obtained by using the developer to which alkanol amine containing primary amino group was added enabled silver images exhibiting considerably excellent printing durability to be obtained. Further, fine line areas of the original were reproduced satisfactorily while preventing mechanical wear due to printing of the fine line areas. In the cases where alkanol amine containing no primary amino group was added, no printing plate was obtained which had satisfactory properties.

EXAMPLE 4

The lithographic offset printing plate adapted to the silver salt complex diffusion transfer method was "Silver Master" (trade name) manufactured by Mitsubishi Paper Mills, Ltd. An image was exposed to the original of the lithographic offset printing plate by a process camera having an image reversal mechanism.

The developing apparatus, the scanning speed performed by the developper dropping nozzle, the printing plate conveying speed and the quantity of the developer applied to the printing plate were same as in the case of the previously described Example 2.

The samples were allowed to stand for about 5 seconds after the developer was applied and spread, followed by immediately and sufficiently cleaning the sample with water.

TABLE 1

| No. | <Developers according to the present invention and Comparative developers> | | | | |
|---|---|---|---|---|---|
| | 1 | 2 | 3 | 4 | 5 |
| Water | 700 | 700 | 700 | 700 | 700 |

TABLE 1-continued

| | <Developers according to the present invention and Comparative developers> | | | | |
|---|---|---|---|---|---|
| No. | 1 | 2 | 3 | 4 | 5 |
| Sodium Hydroxide/g | 5 | 5 | 5 | 5 | 5 |
| Potassium Hydroxide/g | 14 | 14 | 14 | 14 | 14 |
| Sulfurous sodium anhydride/g | 50 | 50 | 50 | 50 | 50 |
| Potassium thiocyanate/mol | 0.01 | 0.03 | 0.1 | 0.3 | 0.5 |
| Water is added to make the quantity to be 1 litter. | | | | | |

As comparative samples, developers were prepared which did not contain potassium thiocyanate, and they were processed similarly to the developers containing potassium thiocyanate.

TABLE 2

| | <Comparative developers containing no potassium thiocyanate> | | | |
|---|---|---|---|---|
| No. | 6 | 7 | 8 | 9 |
| Water/ml | 700 | 700 | 700 | 700 |
| Sodium Hydroxide/g | 5 | 5 | 5 | 5 |
| Potassium Hydroxide/g | 14 | 14 | 14 | 14 |
| Sulfurous sodium anhydride/g | 50 | 50 | 50 | 50 |
| 3-aminopropanol/mol | 0.01 | 0.03 | 0.05 | 0.1 |
| Water is added to make the quantity to be 1 litter. | | | | |

In the foregoing case, No. 5 shown in Table 5 did not form an image. The lithographic offset printing plates except for No. 5 were dried, followed by setting them to a Heidelberg TOK lithograpinc offset press. Then, the following etching solution was applied uniformly to the surface of the printing plate. Then, the following fountain solution was used so that printing was performed.

TABLE 3

| <Etching Solution> | |
|---|---|
| Water | 600 ml |
| Isopropyl alcohol | 400 ml |
| Ethylene glycol | 50 g |
| 3-mercapto-4-acetoamide-5-n-heptyl-1,2,4-triazole | 1 g |

| <Fountain Solution> | |
|---|---|
| Water | 8 l |
| Citric acid | 6 g |
| Sodium sulfate | 25 g |
| Ethylene glycol | 100 g |
| Colloidal silica (20% solution) | 28 g |

The results of printing performed according to this embodiment and evaluated in accordance with the following criteria are shown in Table 5. The printing durability was judged by the following method.

Printing was performed to make 1,000 to 50,000 sheets and the printing durability was evaluated in accordance with the number of sheet at which lacking for ink took place by employing the following four classes.

TABLE 4

| A | 50,000 sheets or more |
|---|---|
| B | 25,000 sheets or more |
| C | 10,000 sheets or more |
| D | 5,000 sheets or more |

TABLE 5

| No. | Results of Printing Durability | Remarks |
|---|---|---|
| 1 | D | Comparative Sample |
| 2 | B | Present invention |
| 3 | B | Present invention |
| 4 | B | Present invention |
| | The following results were obtained by using developers shown in Table 2 | |
| 6 | D | Comparative Sample |
| 7 | D | Comparative Sample |
| 8 | D | Comparative Sample |
| 9 | D | Comparative Sample |
| 10 | D | Comparative Sample |

As can be seen from Table 5, the lithographic offset printing plates obtained by using the developer to which thiocyanic acid ions were added by a predetermined quantity were added enabled silver images exhibiting considerably excellent printing durability to be obtained. Further, fine line areas of the original were reproduced satisfactorily while preventing mechanical wear due to printing of the fine line areas. Therefore, the lithographic offset printing plate was withstand the printing operation for a long time.

Although the invention has been described in its preferred form with a certain degree of particularly, it is understood that the present disclosure of the preferred form has been changed in the details of construction and the combination and arrangement of parts may be resorted to without departing from the spirit and the scope of the invention as hereinafter claimed.

What is claimed is:

1. A developing apparatus for a lithographic offset printing plate, comprising:
    developer applying means including a pair of rod-shape members which are not rotated and which are adapted for travel of said plate adjacent said rod-shape members; and
    developer supply means disposed above said developer applying means.

2. A developing apparatus for a lithographic offset printing plate according to claim 1, wherein said developer supply means supplies a developer while reciprocating in a widthwise direction of said rod-shape applying means.

3. A developing apparatus for a lithographic offset printing plate according to claim 1, wherein said developer supply means includes a developer supply unit having a developer supply portion in the upper portion thereof and having the lower end formed into a slit-shape opening, and said developer supply portion is disposed on one or more sides of said unit.

4. A developing apparatus for a lithographic offset printing plate according to claim 1, wherein said developer supply means includes
    a developer supply unit having a developer supply portion in the upper portion thereof, the lower end of said developer supply unit being formed into a slit-shape opening, and
    a support plate arranged to support said unit and having means for locating said unit, said unit and said support plate being made detachable.

5. A developing apparatus for a lithographic offset printing plate according to claim 4, wherein said developer supply unit is a developer supply unit so formed that the portions from said developer supply portion to said slit-shape opening are substantially in close contact with each other.

6. A developing apparatus for a lithographic offset printing plate according to claim 1, wherein said developer supply means includes
a developer supply unit having a developer supply portion in the upper portion thereof, the lower end of said developer supply unit being formed into a slit-shape opening; and
heating means disposed on one or more sides of said unit.

7. A developing apparatus for a lithographic offset printing plate according to claim 1 further comprising heating means connected to said rod-shape members to which said developer is supplied so that temperature at which development is performed is adjusted to a desired level.

8. A developing apparatus for a lithographic offset printing plate according to claim 1 further comprising: neutralizing solution supply means disposed downstream from said developer supply means and acting to supply neutralizing solution to the surface of a lithographic offset printing plate, to which said developer has been supplied; and squeezing means disposed downstream from said neutralizing solution supply means and acting to squeeze a mixture solution of said developer and said neutralizing solution.

9. A developing apparatus for a lithographic offset printing plate according to claim 1 further comprising: first squeezing means disposed downstream from said developer supply means and acting to squeeze said developer; neutralizing solution supply means disposed downstream from said first squeezing means and acting to supply neutralizing solution to the surface of said lithographic offset printing plate; and second squeezing means disposed downstream from said neutralizing solution supply means and acting to squeeze said neutralizing solution.

10. A developing apparatus for a lithographic offset printing plate according to claim I, wherein said developer supply means supplies a developer which contains thiocyanic acid ions by a quantity ranged from 0.03 mol or more to 0.3 mol or less per one litter of said developer.

11. A developing apparatus for a lithographic offset printing plate according to claim 1, wherein said developer supply means supplies a developer, which contains alkanol amine having one or a plurality of primary amino groups, by a quantity ranged from 0.15 mol or more to 1.2 mol or less per one litter of said developer.

12. A method of developing a lithographic offset printing plate comprising steps of:
providing developer applying means which includes a pair of non-rotatable rod-shape members disposed adjacent to a moving path of said lithographic offset printing plate in such a manner as to allow said lithographic offset printing plate to move through a gap between said members; and
supplying a developer to one of said rod-shape members which faces surface of said lithographic offset printing plate on which a silver halide emulsion layer has been formed.

13. A method of developing a lithographic offset printing plate according to claim 12, wherein said developer is supplied to either of said rod-shape members so that said developer is reserved in a nip between said pair of rod-shape members, and then said lithographic offset printing plate is brought to said rod-shape members to perform development.

14. A method of developing a lithographic offset printing plate according to claim 12, wherein said developer is supplied to either of said rod-shape members while moving said developer supply means for supplying said developer in the longitudinal direction of said rod-shape members.

15. A method of developing a lithographic offset printing plate according to claim 12, wherein said developer is supplied to either of said rod-shape members while moving said developer supply means for supplying said developer in the longitudinal direction of said rod-shape members, and then development of said lithographic offset printing plate is performed while moving said developer supply means in the longitudinal direction of said rod-shape members.

16. A method of developing a lithographic offset printing plate according to claim 12, wherein heating means is provided for said developer supply means for supplying said developer to heat said developer to be supplied to either of said rod-shape members.

17. A method of developing a lithographic offset printing plate according to claim 12, wherein either of said rod-shape members is heated.

18. A method of developing a lithographic offset printing plate according to claim 12, wherein supply of said developer to said surface of said lithographic offset printing plate to which said silver halide emulsion layer has been formed by application, supply of neutralizing solution to said surface to which said developer has been supplied, and removal of a mixture solution of said developer and said neutralizing solution from said surface are performed sequentially.

19. A method of developing a lithographic offset printing plate according to claim 12, wherein supply of said developer to said surface of said lithographic offset printing plate to which said silver halide emulsion layer has been formed by application, removal of said developer from said surface, supply of neutralizing solution to said surface, and removal of said neutralizing solution from said surface are performed sequentially.

20. A method of developing a lithographic offset printing plate according to claim 12, wherein said developer contains thiocyanic acid ions by a quantity ranged from 0.03 mol or more to 0.3 mol or less per one litter of said developer.

21. A method of developing a lithographic offset printing plate according to claim 12, wherein said developer contains thiocyanic acid ions by a quantity ranged from 0.15 mol or more to 1.2 mol or less per one litter of said developer.

* * * * *